United States Patent [19]

Uden et al.

[11] 3,930,115

[45] Dec. 30, 1975

[54] ELECTRIC COMPONENT ASSEMBLY COMPRISING INSULATING FOIL BEARING CONDUCTOR TRACKS

[75] Inventors: Edward Uden, Tangstedt; Bengi Götze, Hamburg, both of Germany

[73] Assignee: U.S. Philips Corporation, New York, N.Y.

[22] Filed: Mar. 11, 1974

[21] Appl. No.: 449,850

Related U.S. Application Data

[63] Continuation of Ser. No. 232,865, March 8, 1972, abandoned.

[30] Foreign Application Priority Data

May 19, 1971 Germany ............................ 2124887

[52] U.S. Cl. ................. 174/52 FP; 29/626; 29/588; 174/16 HS; 317/100; 317/101 CC; 317/101 CP; 339/17 CF

[51] Int. Cl.² ........................................... H05K 1/18

[58] Field of Search ............ 174/68.5, 52 R, 52 PE, 174/DIG. 3, 16 HS; 317/100, 101 CC, 101 CP, 101 CM, 101 CW; 339/17 C, 17 CF; 29/625–627, 588–591

[56] References Cited

UNITED STATES PATENTS

| | | | |
|---|---|---|---|
| 3,248,779 | 5/1966 | Yuska et al. | 317/101 CC X |
| 3,313,986 | 4/1967 | Kilby | 317/101 CW |
| 3,390,308 | 6/1968 | Marley | 174/DIG. 3 X |
| 3,440,027 | 4/1969 | Hugle | 174/DIG. 3 X |
| 3,471,753 | 10/1969 | Burks et al. | 317/101 CC X |
| 3,505,570 | 4/1970 | Sprude et al. | 317/101 CW |
| 3,691,289 | 9/1972 | Rohloff | 174/DIG. 3 X |

FOREIGN PATENTS OR APPLICATIONS

| | | | |
|---|---|---|---|
| 2,021,484 | 7/1970 | France | 317/101 CC |

*Primary Examiner*—Darrell L. Clay
*Attorney, Agent, or Firm*—Frank R. Trifari; Leon Nigohosian

[57] ABSTRACT

An electric miniature component in which the body of the component is contacted by means of a flexible, electrically insulating foil supporting conductor tracks with connection zones, in which the foil is adhered around a U-shaped supporting member in such manner that the connection zones of the conductor tracks surround the connection sides of the limbs of the U-profile.

8 Claims, 5 Drawing Figures

ELECTRIC COMPONENT ASSEMBLY COMPRISING INSULATING FOIL BEARING CONDUCTOR TRACKS

This is a continuation of application Ser. No. 232,865, filed Mar. 8, 1972, now abandoned.

The invention relates to an electric miniature component, preferably a semiconductor device, in which the body of the component is contacted by means of a flexible, electrically insulating foil supporting conductor tracks with connection zones, the foil being connected to a supporting member which is constructed so that said body can be incorporated by a connection fitting making contact on said foil with the connection zones of the conductor tracks.

A flexible insulating foil having a pattern of conductor tracks to which a body of an electric component is secured is described in "Proc. of the Electronic Components Conference" — I.E.E.E., 1967, pp. 283–290.

In components in which the body is contacted by means of a foil, it is required in connection with the series production to construct the contacting of the connection conductors as simple as possible and with a minimum of costs.

It is known to construct the connection contacting in such manner that the conductor tracks provided on the foil (on their sides situated opposite to the body) project over the foil and are contacted at said free ends with a printed circuit board (see "Electronics" 1971, No. 3, pp. 44–48). This method requires complicated measures during the manufacture.

It is furthermore known to connect the foil to a supporting member which is constructed so that the member can be incorporated by a connection fitting making contact on the foil with the connection zones of the conductor tracks, see French Pat. No. 2,021,484. As a result of the plate-shaped construction of the supporting members, however, the component occupies much space and the connection in the connection fitting is not very stable.

It is the object of the invention to avoid the drawbacks associated with the known components of the above-mentioned type. According to the invention this problem is solved in that the supporting member has a U-shaped profile and the foil is connected to it such that the connection zones of the conductor tracks surround the connection sides of the limbs of the supporting member.

The invention includes providing all the supply leads required for an electric component by conductor tracks provided on a foil. The contacting of components, for example integrated circuits, can be carried out rapidly while saving extra operations during the manufacture, for example, a wire contacting or the making free of connection zones of conductor tracks. A very stable support is obtained which corresponds in size with the conventional synthetic housings for integrated circuits. The foil may be provided on the outside of the U-shaped supporting member and surround the limbs of the U-profile. The foil may also be provided on the inside of the U-shaped supporting member and surround the limbs of the U-profile.

In a further embodiment, the U-shaped supporting member comprises a recess in the place where the body of the component is to be provided. The U-shaped supporting member may also comprise a trough-like recess, at which recess the foil contains an aperture so that the conductor tracks are partly free and the body of the component is provided between the supporting member and the conductor tracks.

The U-shaped supporting member is provided with at least one abutment member ensuring a fixed position between the component and the connecting fitting.

A few embodiments of the invention are shown in the drawing and will be described in greater detail below. In the Figures.

A connection fitting is to be understood to mean in this connection any device for incorporating, suitable to hold the component in a mechanical manner and to realise an electric contact with it.

Figure 1:
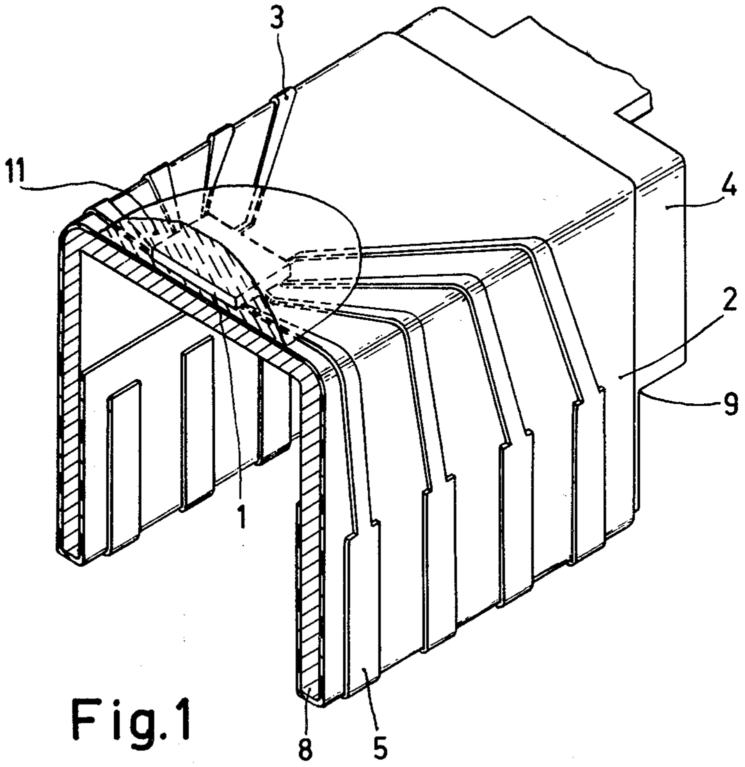
FIG. 1 shows an electric component contacted with a foil according to the invention.

FIG. 1 shows a first embodiment of the component according to the invention. The body 1 of the component, for example an integrated circuit, is in "flip-chip" arrangement soldered to conductor tracks 3 located on a flexible, electrically insulating foil 2. The connection zones 5 of the conductor tracks 3 are shown thicker in the drawing and serve as electrical contacts with a connection fitting 7 (see FIG. 5).

In order to protect the body 1 of the component from influences from without, the body comprises an envelope 11 of a synthetic material.

The conductor tracks 3 can be obtained by providing a layer on the foil 2, succeeded by selective etching by means of a photolithographic method. The tracks 3 consist, for example, of copper and, in order to facilitate the provision of a soldered joint with the body 1, they can be tin-plated or gold-plated.

The foil 2, for example a polyimide foil, is secured on the supporting member 4 substantially throughout its surface remote from the conductor tracks 2, the foil 2 being so secured by means of a suitable adhesive, for example, an epoxy resin, such that the foil 2 adheres around the sealing sides 8 of the supporting member 4 so that the inner sides of the limbs of the U-shaped supporting member 4, or at least parts thereof, are also covered by the foil 2.

The supporting member 4 may be bent to the form of a U from aluminum strip having a thickness of approximately 0.5 mm and, if desirable, may be perforated at the region where the component crystal is to be provided, so as to avoid stresses owing to differences in thermal expansion.

Figure 5:
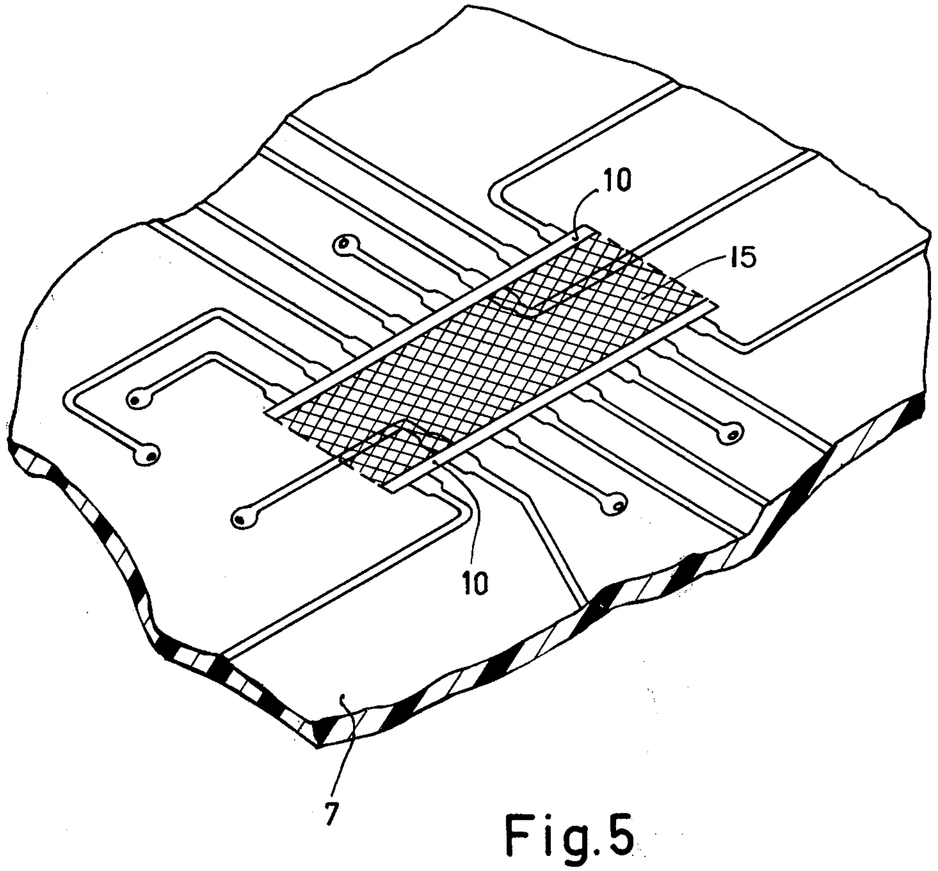
FIG. 5 shows a connection fitting for an electric component according to the invention.

The limbs of the supporting member 4 have an abutment 9 which ensures a fixed location between the component and the connection fitting 7 (FIG. 5).

Figure 2:
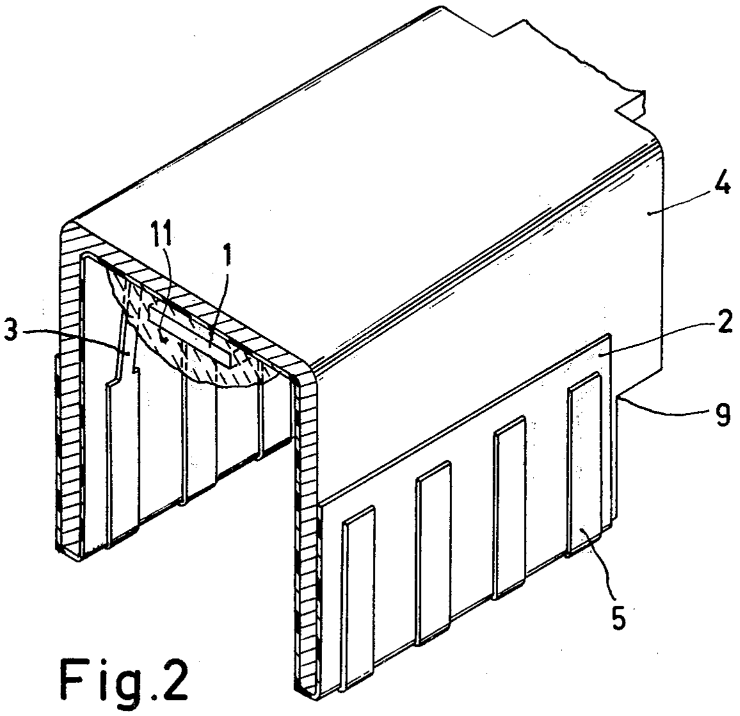
FIG. 2 shows an electric component contacted with a foil according to the invention and provided on the supporting member in a slightly different manner from FIG. 1.

FIG. 2 shows another embodiment of the electric component of the present invention, in which the foil 2, having the body 1 of the component contacted to the conductor tracks 3, adheresr completely around the inner surface of the U-shaped supporting member 4 instead of the outer surface as shown in FIG. 1. This way of connection may be chosen when the body 1 or the conductor tracks 3 are to be protected in a particular manner.

Figure 3:
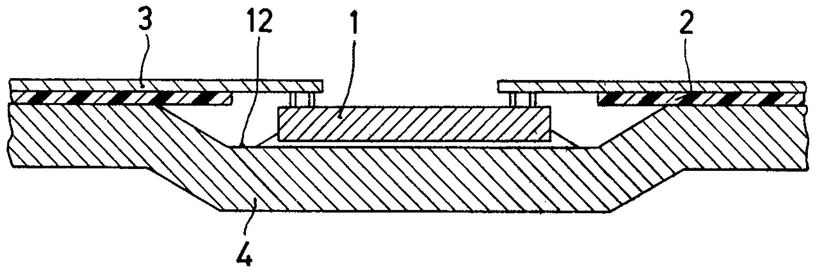
FIG. 3 shows the provision of the body of the component in another embodiment of a component according to the invention.

FIG. 3 shows how the body 1 of the component is directly provided on the supporting member 4 according to an embodiment of the present invention. This is efficacious when a particularly good heat dissipation is desirable. For that purpose, the supporting member 4, which is shown only partly, is provided with a trough-shaped recess 12 which receives the body 1. The foil 2 contains an aperture so that the conductor tracks 3 are partly released and contact the body 1 of the component. The connection of the body 1 of the component with the supporting member 4 can be made by means of a heat-conducting paste or by means of a heatconducting glue.

Figure 4:
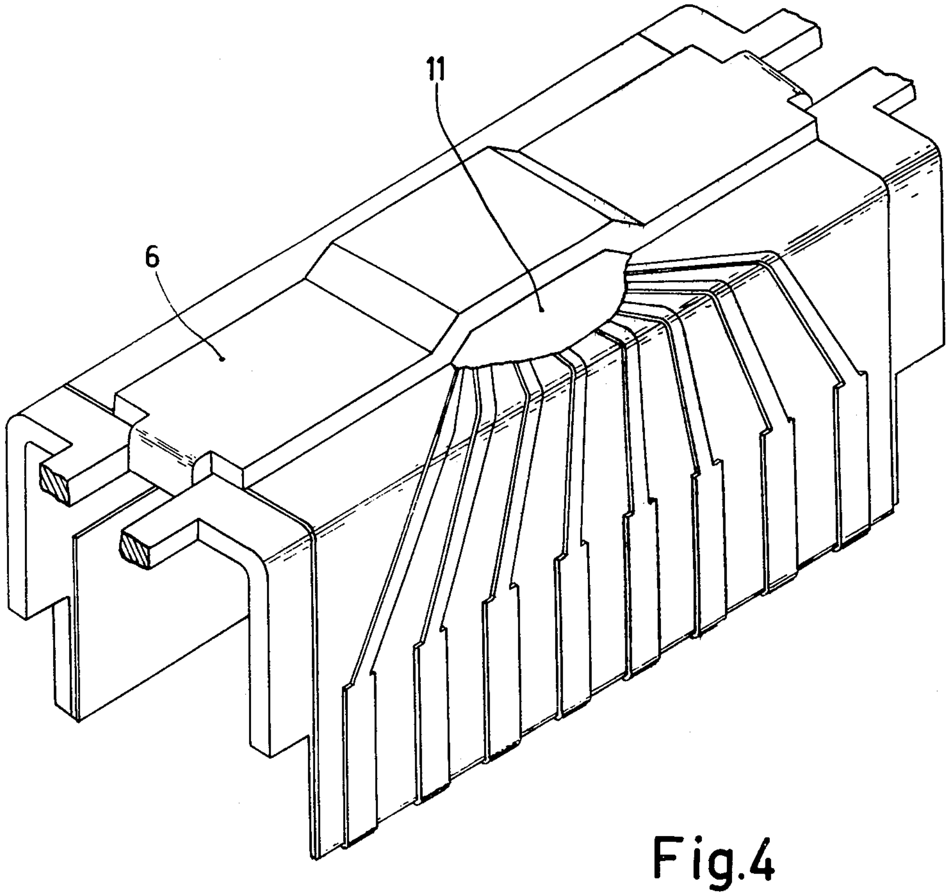
FIG. 4 shows an electric component according to the invention with an additional cooling member.

FIG. 4 shows an additional cooling member 6 provided above the component body 1, the cooling member preferably consisting of the same material as the supporting member 4.

FIG. 5 shows the principle of the connection fitting 7 for an electric component shown in FIG. 1, 2 or 4, with the insertion slots 10 for the part of the limb of the supporting member 4 extending up to the abutment 9. The part 15 of the connection fitting indicated by the shadowing in FIG. 5, may be omitted to simplify the manufacture of the connection fitting.

What is claimed is:

1. An electric miniature component assembly comprising, a. a supporting member having a substantially U-shaped profile and comprising a base portion and spaced apart limb portions that include connection regions, said limb portions having inner and outer surfaces and comprising terminal portions forming plug-in elements, said supporting member including a trough-shaped recess located at said base portion, whereby said assembly can be incorporated with a connection fitting;

b. a flexible, electrically insulating foil secured on said supporting member and having at least a portion thereof disposed at at least one of said inner and outer surfaces of said limb portions, said foil containing an aperture located at said recess;

c. conductor tracks located on said foil and comprising connection zones disposed at respective said connection regions of said limb portions, said connection zones comprising the electrical contact elements of said plug-in elements and being directly accessible for electrical connection thereto whereby said connection zones can be inserted in and contact said connection fitting when said assembly is incorporated with said connection fitting, portions of said conductor tracks being located at said aperture and free of said foil; and d. an electrical component disposed at said recess between said base portion and said conductor track portions and being in electrical connection with said conductor tracks.

2. An assembly as recited in claim 1, wherein said foil substantially covers said outer surfaces of said limb portions.

3. An assembly as recited in claim 1, wherein said foil substantially covers said inner surfaces of said limb portions.

4. An assembly as recited in claim 1, wherein said supporting member includes means for fixing the position of said component with respect to said connection fitting, said means comprising at least one abutment element located at said limb portions.

5. An assembly as recited in claim 1, wherein said component is a semiconductor device.

6. An electric miniature component assembly as in claim 1, wherein said insulating foil consists of polyimide material.

7. A sub-assembly for incorporating an electric component with a connection fitting, comprising, a. a supporting member having a substantially U-shaped profile comprising a base portion and limb portions, said limb portions comprising connection regions and inner and outer surface and being adapted to permit said sub-assembly to be incorporated with a connection fitting, said base portion comprising at least one of a recess and a perforated region adapted to receive said electric component thereat;

b. a flexible, electrically insulating foil secured on said supporting member and having at least a portion thereof disposed at at least one of said inner and outer surfaces of said limb portions; and c. conductor tracks located on said foil and extending over said base portion, said tracks being adapted to be electrically connected to said electric component and comprising connection zones disposed at respective said connection regions of said limb portions, whereby said connection zones are inserted into and contact said connection fitting when said sub-assembly is incorporated with said connection fitting.

8. An electric miniature component assembly comprising, a. a supporting member having substantially U-shaped profile and comprising a base portion and spaced apart limb portions that include connection regions, said limb portions having inner and outer surfaces and comprising terminal portions forming plug-in elements and said base portion includes a perforated region, whereby said assembly can be incorporated with a connection fitting;

b. a flexible, electrically insulating foil secured on said supporting member and having at least a portion thereof disposed at at least one of said inner and outer surfaces of said limb portions;

c. conductor tracks located on said foil and comprising connection zones disposed at respective said connection regions of said limb portions, said connection zones comprising the electrical contact elements of said plug-in elements and being directly accessible for electrical connection thereto whereby said connection zones can be inserted in and contact said connection fitting when said assembly is incorporated with said connection fitting; and d. an electrical device disposed at said perforated region and in electrical connection with said conductor tracks.

* * * * *